US008771628B2

(12) United States Patent
Sivarajan et al.

(10) Patent No.: US 8,771,628 B2
(45) Date of Patent: Jul. 8, 2014

(54) AQUEOUS CARBON NANOTUBE APPLICATOR LIQUIDS AND METHODS FOR PRODUCING APPLICATOR LIQUIDS THEREOF

(75) Inventors: Ramesh Sivarajan, Shrewsbury, MA (US); Thomas Rueckes, Rockport, MA (US); Rahul Sen, Wilmington, MA (US); Brent M. Segal, Woburn, MA (US); Eliodor G. Ghenciu, King of Prussia, PA (US); Jonathan W. Ward, Fairfax, VA (US); Tzong-Ru T. Han, El Cerrito, CA (US)

(73) Assignee: Nantero Inc., Woburn, MA (US)

( * ) Notice: Subject to any disclaimer, the term of this patent is extended or adjusted under 35 U.S.C. 154(b) by 0 days.

(21) Appl. No.: 12/612,445

(22) Filed: Nov. 4, 2009

(65) Prior Publication Data

US 2010/0051880 A1 Mar. 4, 2010

Related U.S. Application Data

(63) Continuation of application No. 11/304,315, filed on Dec. 15, 2005, now Pat. No. 7,666,382.

(60) Provisional application No. 60/636,673, filed on Dec. 16, 2004, provisional application No. 60/704,858, filed on Aug. 2, 2005.

(51) Int. Cl.
*D01F 9/12* (2006.01)

(52) U.S. Cl.
USPC ............... 423/447.1; 423/447.3; 423/445 B; 977/746; 977/845; 252/502

(58) Field of Classification Search
USPC ........ 423/447.1–447.3, 445 B; 977/742–754, 977/842–848; 428/367; 252/502
See application file for complete search history.

(56) References Cited

U.S. PATENT DOCUMENTS

| 6,057,637 | A | 5/2000 | Zettl |
| 6,187,823 | B1 | 2/2001 | Haddon et al. |
| 6,277,318 | B1 | 8/2001 | Bower |
| 6,331,262 | B1 | 12/2001 | Haddon et al. |
| 6,342,276 | B1 | 1/2002 | You |

(Continued)

FOREIGN PATENT DOCUMENTS

| EP | 0947466 | 6/1999 |
| GB | 2364933 | 2/2002 |

(Continued)

OTHER PUBLICATIONS

Zhao, et al., Water-Soluble and Optically pH-Sensitive Single-Walled Carbon Nanotubes from Surface Modification, J. Am. Chem. Soc. 2002; 124: 12418-12419.*

(Continued)

*Primary Examiner* — Daniel C McCracken
(74) *Attorney, Agent, or Firm* — Nantero Inc.

(57) ABSTRACT

Certain applicator liquids and method of making the applicator liquids are described. The applicator liquids can be used to form nanotube films or fabrics of controlled properties. An applicator liquid for preparation of a nanotube film or fabric includes a controlled concentration of nanotubes dispersed in a liquid medium containing water. The controlled concentration is sufficient to form a nanotube fabric or film of preselected density and uniformity.

19 Claims, 4 Drawing Sheets

(56) References Cited

U.S. PATENT DOCUMENTS

| | | | |
|---|---|---|---|
| 6,368,569 B1 * | 4/2002 | Haddon et al. | 423/460 |
| 6,409,567 B1 | 6/2002 | Amey, Jr. et al. | |
| 6,423,583 B1 | 7/2002 | Avouris et al. | |
| 6,495,116 B1 | 12/2002 | Herman | |
| 6,495,258 B1 | 12/2002 | Chen et al. | |
| 6,515,339 B2 | 2/2003 | Shin et al. | |
| 6,528,020 B1 | 3/2003 | Dai et al. | |
| 6,531,513 B2 | 3/2003 | Haddon et al. | |
| 6,574,130 B2 | 6/2003 | Segal et al. | |
| 6,630,772 B1 | 10/2003 | Bower et al. | |
| 6,641,793 B2 | 11/2003 | Haddon et al. | |
| 6,643,165 B2 | 11/2003 | Segal et al. | |
| 6,645,628 B2 | 11/2003 | Shiffler, Jr. et al. | |
| 6,706,402 B2 | 3/2004 | Rueckes et al. | |
| 6,707,098 B2 | 3/2004 | Hofmann et al. | |
| 6,752,977 B2 | 6/2004 | Smalley et al. | |
| 6,764,628 B2 * | 7/2004 | Lobovsky et al. | 264/172.15 |
| 6,808,746 B1 | 10/2004 | Dai et al. | |
| 6,833,558 B2 | 12/2004 | Lee et al. | |
| 6,858,197 B1 | 2/2005 | Delzeit | |
| 6,863,942 B2 | 3/2005 | Ren et al. | |
| 6,888,773 B2 | 5/2005 | Morimoto | |
| 6,890,780 B2 | 5/2005 | Lee | |
| 6,896,864 B2 | 5/2005 | Clarke et al. | |
| 6,899,945 B2 | 5/2005 | Smalley et al. | |
| 6,905,892 B2 | 6/2005 | Esmark | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,924,538 B2 | 8/2005 | Jaiprakash et al. | |
| 6,946,410 B2 | 9/2005 | French et al. | |
| 7,057,402 B2 | 6/2006 | Cole et al. | |
| 7,115,864 B2 | 10/2006 | Colbert et al. | |
| 7,566,478 B2 | 7/2009 | Ward et al. | |
| 2001/0004979 A1 | 6/2001 | Han et al. | |
| 2002/0081380 A1 | 6/2002 | Dillon et al. | |
| 2002/0160111 A1 | 10/2002 | Sun et al. | |
| 2003/0004058 A1 | 1/2003 | Li et al. | |
| 2003/0065206 A1 | 4/2003 | Bolskar et al. | |
| 2003/0122111 A1 | 7/2003 | Glatkowski | |
| 2003/0177450 A1 | 9/2003 | Nugent | |
| 2003/0180472 A1 * | 9/2003 | Zhou et al. | 427/430.1 |
| 2003/0200521 A1 | 10/2003 | DeHon et al. | |
| 2003/0211028 A1 * | 11/2003 | Smalley et al. | 423/447.1 |
| 2003/0220518 A1 | 11/2003 | Bolskar et al. | |
| 2004/0005723 A1 | 1/2004 | Empedocles et al. | |
| 2004/0007528 A1 | 1/2004 | Bakajin et al. | |
| 2004/0023253 A1 | 2/2004 | Kunwar et al. | |
| 2004/0031975 A1 | 2/2004 | Kern et al. | |
| 2004/0034177 A1 | 2/2004 | Chen | |
| 2004/0041154 A1 | 3/2004 | Watanabe et al. | |
| 2004/0043527 A1 | 3/2004 | Bradley et al. | |
| 2004/0071949 A1 | 4/2004 | Glatkowski et al. | |
| 2004/0099438 A1 | 5/2004 | Arthur et al. | |
| 2004/0104129 A1 | 6/2004 | Gu et al. | |
| 2004/0132070 A1 | 7/2004 | Star et al. | |
| 2004/0181630 A1 | 9/2004 | Jaiprakash et al. | |
| 2004/0253167 A1 | 12/2004 | Silva et al. | |
| 2004/0265550 A1 | 12/2004 | Glatkowski et al. | |
| 2004/0266106 A1 | 12/2004 | Lee | |
| 2005/0053525 A1 | 3/2005 | Segal et al. | |
| 2005/0058590 A1 | 3/2005 | Sen et al. | |
| 2005/0058797 A1 | 3/2005 | Sen et al. | |
| 2005/0065741 A1 | 3/2005 | Segal et al. | |
| 2005/0095938 A1 | 5/2005 | Rosenberger et al. | |
| 2005/0212014 A1 | 9/2005 | Horibe et al. | |
| 2005/0269553 A1 | 12/2005 | Sen et al. | |
| 2005/0269554 A1 | 12/2005 | Sen et al. | |
| 2006/0052509 A1 | 3/2006 | Saitoh | |
| 2006/0204427 A1 | 9/2006 | Ghenciu et al. | |
| 2006/0237537 A1 | 10/2006 | Empedocles | |
| 2007/0004191 A1 | 1/2007 | Gu et al. | |

FOREIGN PATENT DOCUMENTS

| | | |
|---|---|---|
| JP | 11008690 | 1/1999 |
| JP | 11210336 | 7/1999 |
| JP | 2002258885 | 4/2002 |
| WO | WO-98/39250 | 9/1998 |
| WO | WO-99/65821 | 12/1999 |
| WO | WO-01/03208 | 1/2001 |
| WO | WO-02/45113 | 6/2002 |
| WO | WO-02/48701 | 6/2002 |
| WO | WO-03/016901 | 2/2003 |
| WO | WO-03/034142 | 4/2003 |
| WO | WO-2006/065937 | 6/2006 |

OTHER PUBLICATIONS

Cai, et al., Carbon nanotube enhanced electrochemical DNA biosensor for DNA hybridization detection, Anal Bioanal Chem 2003; 375: 287-293.*

Chaing, et al., Purifcation and Characterization of Single-Wall Carbon Nanotubes, J. Phys. Chem. B. 2001; 105: 1157-1161.*

Hennrich, et al., Reversible modification of the absorption properties of single-walled carbon nanotube films via nitric acid exposure, Phys. Chem. Chem. Phys. 2003; 5: 178-183.*

Jia, Production of short multi-walled carbon nanotubes, Carbon 1999; 37: 903-906.*

Kim, et al., Electrical conductivity of chemically modified multiwalled carbon nanotube/epoxy composites, Carbon 2005; 43: 23-20 (published online Oct. 18, 2004).*

US Peroxide, "What is the pH of H2O2 solutions?" accessed online on May 3, 2012 at http://www.h2o2.com/faqs/FaqDetail.aspx?fld=26.*

Hu, et al., Nitric Acid Purification of Single-Walled Carbon Nanotubes, J. Phys. Chem. B 2003; 107: 13838-13842.*

Cook, Assessing the Use and Application of Zero-Valent Iron Nanoparticle Technology for Remediation at Contaminated Sites, Aug. 2009, accessed online at <http://cluin.org/download/studentpapers/zero-valent-iron-cook.pdf> on Nov. 26, 2013.*

Affidavit signed by Brent Segal on Aug. 11, 2008, filed in U.S. Appl. No. 10/860,433 on Jan. 29, 2009, 27 pages.*

Haddon, et al., Purification and Separation of Carbon Nanotubes, MRS Bulletin, pp. 252-259, Apr. 2004.*

Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-L91, 2002.

Riggs, et al., "Optical Limiting Properties of Suspended and Solubilized Carbon Nanotubes," J. Phys. Chem., B, 2000, vol. 104, No. 30, pp. 7071-7076.

Awano, Y., "Graphene for VLSI: FET and Interconnect Applications," IEDM 2009 Technical Digest, pp. 10.1.1-10.1.4.

Brown, K. M., "System in package "The Rebirth of SIP"," 2004 IEEE Custom Integrated Circuits, May 2004, 6 pgs.

Crowley, et al., "512 Mb PROM with 8 layers of antifuse/Diode cells," IEEE International Solid-State Circuits Conference, vol. XLVI, Feb. 2003, pp. 284-285.

Fuhrer, et al., "High-Mobility Nanotube Transistor Memory," Nano Letters, vol. 2, No. 7, 2002, pp. 755-759.

Huai, Y., "Spin-Transfet Torque MRAM (STT-MTAM): Challenges and Prospects," AAPS Bulletin, vol. 18, No. 6, Dec. 2008, pp. 33-40.

Jiang, et al., "Performance Breakthrough in 8nm Gate-All-Around Length Gate-All-Around Nanowire Transistors using Metallic Nanowire Contacts," 2008 Symposium of VLSI Technology Digest of Technical Papers, pp. 34-35.

Niu, et al., "High Power Electrochemical Capacitors Based on Carbon Nanotube Electrodes," Appl. Phys. Ltrs., vol. 70, No. 11, Mar. 1997, pp. 1480-1482.

Novak, et al., "Nerve Agent Using Networks of Single-Walled Carbon Nanotubes," Appl. Phys. Ltr., vol. 83, No. 19, Nov. 2003, pp. 4026-4028.

Snow, et al., "Random Networks of Carbon Nanotubes as an Electronic Material," App. Phys. Ltrs., vol. 82, No. 13, Mar. 2003, pp. 2145-2147.

Star, et al., "Nanoelectronic Carbon Dioxide Sensors," Adv. Mater., vol. 16, No. 22, 2004, pp. 2049-2052.

(56) References Cited

OTHER PUBLICATIONS

Star, et al., "Nanotube Optoelectronic Memory Devices," Nano Letters, vol. 4, No. 9, 2004, pp. 1587-1591.
Zhou, et al., "p-Channel Thin Film Transistors and p-n Diodes Based on Single Wall Carbon Nanotube Networks," Nano Letters, vol. 4, No. 10, 2004, pp. 2031-2035.
Ago, et al., "Workfunction of Purified and Oxidized Carbon Nanotubes," Synthetic Metals, vol. 103, 1999, pp. 2494-2495.
Ajayan, et al., "Applications of Carbon Nanotubes," Topics Appl. Phys., vol. 80, 2001, pp. 391-425.
Amblard, G., "Development and characterization of carbon nanotube processes for NRAM technology," Proc. of SPIE, 2011, vol. 7970, pp. 797017-1-97017-7.
Ausman, et al., "Organic Solvent Dispersions of Single-Walled Carbon Nanotubes: Toward Solutions of Pristine Nanotubes," J. Phys. Chem. B, 2000, vol. 104, p. 8911.
Bahr, et al., Dissolution of Small Diameter Single-Wall Carbon Nanotubes in Organic Solvents, Chem. Comm. 2001, pp. 193-194.
Banerjee, et al., "Functionalization of Carbon Nanotubes with a Metal-Containing Molecular Complex," Nano Letters, vol. 2, No. 1, 2002, pp. 49-53.
Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.
Bonard, et al., "Monodisperse Multiwall Carbon Nanotubes Obtained with Ferritin as Catalyst," Nano Letters, vol. 2, No. 6, 2002, pp. 665-667.
Brock, et al., "Carbon Nanotube Memories and Fabrics in a Radiation Hard Semiconductor Foundry," 2005 IEEE Conference, 9 pgs.
Cassell, et al., "Large Scale CVD Synthesis of Single-Walled Carbon Nanotubes," J. Phys. Chem. B, vol. 103, 1999, pp. 6484-6492.
Chen, et al., "Dissolution of Full-Length Single-Walled Carbon Nanotubes," J. Phys. Chem. B, 2001, vol. 105, pp. 2525-2528.
Chen, et al., "Heterogeneous Single-Walled Carbon Nanotube Catalyst Discovery and Optimization," Chem. Mater., vol. 14, 2002, pp. 1891-1896.
Chen, et al., "Solution Properties of Single-Walled Nanotubes," Science, 1998, vol. 282, pp. 95-98.
Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.
Colomer, et al., "Different Purification Methods of Carbon Nanotubes Produced by Catalytic Synthesis," Synthetic Metals, 1999, vol. 103, pp. 2482-2483.
Cui, et al., "Carbon Nanotube Memory Devices of High Charge," Applied Phys. Ltrs., vol. 81, No. 17, Oct. 2002, pp. 3260-3262.
Dai, et al., "Controlled Chemical Routes to Nanotube Architectures, Physics, and Devices," J. Phys. Chem. B, vol. 103, 1999, pp. 11246-11255.
Delzeit, et al., "Multilayered Metal Catalysts for Controlling the Density of Single-Walled Carbon Nanotube Growth," Chem. Phys. Ltrs., vol. 348, 2001, pp. 368-374.
Desai, et al., "Freestanding Carbon Nanotube Specimen Fabrication," Proceeding 2005 5$^{th}$ IEEE Conference on Nanotechnology, Nagoya, Japan, Jul. 2005.
Dillon, et al., "A Simple and Complete Purification of Single-Walled Carbon Nanotube Materials," Adv. Mater., 1999, vol. 11, No. 16, pp. 1354-1358.
Engel, et al., "Thin Film Nanotube Transistors Based on Self-Assembled, Cligned, Semiconducting Carbon Nanotube Arrays," ACS Nano, 2008, vol. 2, No. 12, pp. 2445-2452.
Franklin, et al., "An Enhanced CVD Approach to Extensive Nanotube Networks with Directionality," Adv. Mater., vol. 12, No. 12, 2000, pp. 890-894.
Georgakilas, et al., "Organic Functionalization of Carbon Nanotubes," J. Am. Chem. Soc., 2002, vol. 124, No. 5, pp. 760-761.
Gromov, et al., "Purification of Carbon Nanotubes," Caramel Workshop, Jan. 23, 2002, 13 pgs.
Haddon, et al., "Purification and Separation of Carbon Nanotubes," MRS Bulletin, Apr. 2004, pp. 252-259 (www.mrs.org/publicatons/bulletins).
Hafner, et al., "Catalytic Growth of Single-Wall Carbon Nanotubes from Metal Particles," Chem. Phys. Ltrs., vol. 296, 1998, pp. 195-202.
Hirsch, A., "Functionalization of Single-Walled Carbon Nanotubes," Angew. Chem. Int. Ed., 2002, vol. 41, No. 11, pp. 1853-1859.
Hou, et al., "Multi-Step Purification of Carbon Nanotubes," Carbon, 2002, vol. 40, pp. 81-85.
International Search Report, International Patent Application No. PCT/US05/18467 dated Oct. 1, 2007, 5 pages.
International Search Report, International Patent Application No. PCT/US05/18539 dated Sep. 18, 2006, 4 pages.
International Search Report, International Patent Application No. PCT/US05/45316 dated Sep. 6, 2005, 2 pages.
Islam, et al., "High Weight Fraction Surfactant Solubilization of Single-Wall Carbon Nanotubes in Water," Nano Letters, 2003, vol. 3, No. 2, pp. 269-273.
Jeong, et al., "A Purification Method of Single-Wall Carbon Nanotubes Using H2S and 02 Mixture Gas," Chem. Phys. Ltrs., vol. 344, Aug. 2001, pp. 18-22.
Johnson, R. Colin, "IBM Grows Nanotube Patterns on Silicon Wafers," EE Times, Sep. 3, 2002, 1 page.
Joselevich, et al., "Vectorial Growth of Metallic and Semiconducting Single-Wall Carbon Nanotubes," Nano Letters, vol. 0, No. 0, A-E, 2002.
Khan, et al., "Solubilization of Oxidized Single-Walled Carbon Nanotube in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERC, Nantero, Inc., Jun. 14, 2010, 4 pages.
Kong, et al., "Chemical Vapor Deposition of Methane for Single-Walled Carbon Nanotubes," Chem. Phys. Ltrs., vol. 292, Aug. 1998, pp. 567-574.
Kong, et al., "Nanotube Molecular Wires as Chemical Sensors," Science, vol. 287, Jan. 2000, pp. 622-625.
Li, et al., "Carbon Nanotube Nanoelectrode Array for Ultrasensitive DNA Detection," Nano Letters, vol. 3, No. 5, 2003, pp. 597-602.
Li, et al., "Growth of Single-Walled Carbon Nanotubes from Discrete Catalytic Nanoparticles of Various Sizes," J. Phys. Chem. B, vol. 105, 2001, pp. 11424-11431.
Li, et al., "Preparation of Monodispersed Fe—Mo Nanoparticles as the Catalyst for CVD Synthesis of Carbon Nanotubes," Chem. Mater., vol. 13, 2001, pp. 1008-1014.
Martinez, et al., "Modifications of Single-Wall Carbon Nanotubes upon Oxidative Purification Treatments," http://www.iop.org/EJ/abstract/0957-4484/14/7/301, printed May 20, 2004.
Matarredona, et al., "Dispersion of Single-Walled Carbon Nanotubes in Aqueous Solutions of the Anionic Surfactant," J. Phys. Chem., 2003, vol. 107, pp. 13357-13367.
Mickelson, et al., "Solution of Fluorinated Single-Wall Carbon Nanotubes in Alcohol Solvents," J. Phys. Chem. B, 1999, vol. 103, pp. 4318-4322.
Moore, et al., "Individually Suspended Single-Walled Carbon Nanotubes in Various Surfactants," Nano Letters, 2003, vol. 3, No. 10, pp. 1379-1382.
"Multifunctional Nanotube Composites," http://www.orni.gov/-odg/compositesmain.html, printed May 20, 2004, 5 pgs.
Murphy, et al., "High-Yield Nondestructive Purification and Quantification Method for Multiwalled Carbon Nanotubes," J. Phys. Chem. B, 2002, vol. 106, pp. 3087-3091.
Nerushev, et al., "Carbon Nanotube Films Obtained by Thermal Chemical Vapour Deposition," J. Mater. Chem., vol. 11, 2001, pp. 1122-1132.
Niyogi, et al., "Ultrasonic Dispersions of Single-Walled Carbon Nanotubes," J. Phys. Chem. B, 2003, vol. 107, pp. 8799-8804.
O'Connell, et al., "Reversible Water-Solubilization of Single-Walled Carbon Nanotubes by Polymer Wrapping," Chem. Phys. Ltr., 2001, vol. 342, pp. 256-271.

(56) References Cited

OTHER PUBLICATIONS

Onoa, et al., "Bulk Production of Singly Dispersed Carbon Nanotubes with Prescribed Lengths," Nanotechnology, vol. 16, 2005, pp. 2799-2803.
Parikh, et al., "Flexible Vapour Sensors Using Single Walled Carbon Nanotubes," Sensors and Actuators B, vol. 113, 2006, pp. 55-63.
Peigney, et al., "A Study of the Formation of Single- and Double-Walled Carbon Nanotubes by a CVD Method," J. Phys. Chem. B, vol. 105, 2001, pp. 9699-9710.
Pompeo, et al., "Water Solubilization of Single-Walled Carbon Nanotubes by Functionalization with Glucosamine," Nano Letters, 2002, vol. 2, No. 4, pp. 369-373.
Qi, et al., "Toward Large Arrays of Multiplex Functionalized Carbon Nanotube Sensors for Highly Sensitive and Selective Molecular Detection," Nano Letters, vol. 3, No. 3, 2003, pp. 347-351.
Riggs, et al., "Strong Luminescence of Solubilized Carbon Nanotubes," J. Am. Chem. Soc., 2000, vol. 122, pp. 5879-5880.
Rinzler, et al., "Large-Scale Purification of Single-Wall Carbon Nanotubes: Process, Product and Characterization," App. Phys. A, 1998, vol. 67, pp. 29-37.
Rosendale, et al., "A 4 Megabit Carbon Nanotube-based Nonvolatile Memory (NRAM)," ESSCIRC, 2010 Proceedings, pp. 478-481.
Rueckes, et al., "Carbon Nanotube-Based Nonvolatile Random Access Memory for Molecular Computing," Science, 2000, vol. 289, pp. 94-97.
Servalli, G., "A 45nm Generation Phase Change Memory Technology," IEDM 2009 Technical Digest, pp. 5.7.1-5.7.4.
Shelimov, et al., "Purification of Single-Wall Carbon Nanotubes by Electronically Assisted Filtration," Chem. Phys. Ltrs., vol. 282, 1998, pp. 429-434.
Sotiropoulou, et al., "Carbon Nanotube Array-Based Biosensor," Anal Bioanal Chem, vol. 375, 2003, pp. 103-105.
Star, et al., "Preparation and Properties of Polymer-Wrapped Single-Walled Caron Nanotubes," Angew. Chem. Int. Ed. 2001, vol. 40, pp. 1721-1725.
Sun, et al., "Soluble Dendron-Functionalized Carbon Nanotubes: Preparation, Characterization, and Properties," Chem. Mater., 2001, vol. 13, pp. 2864-2869.
Sun, et al., "High Dissolution and Strong Light Emission of Carbon Nanotubes in Aromatic Amine Solvents," J. Am. Chem. Soc. 2001, vol. 123, pp. 5348-5349.
Valentini, et al., "Sensors for sub-ppm NO2 Gas Detection Based on Carbon Nanotube Thin Films," Appl. Phys. Ltrs., vol. 82, No. 6, Feb. 2003, pp. 961-963.
Vivekchand, et al., "A New Method of Preparing Single-Walled Carbon Nanotubes," Proc. Indian Acad. Sci (Chem. Sci.), 2003, vol. 115, No. 5 & 6, pp. 209-518.
"Wonderous World of Carbon Nanotubes," http:/students.chem.tue. N1/ifpo3/purification.html, 2004.
Zhang, et al., "Metal Coating on Suspended Carbon Nanotubes and its Implications to Metal-tube Interaction," Chem. Phys. Ltrs., vol. 331, 2000, pp. 35-41.
Zhang, et al., "Select Pathways to Carbon Nanotube Film Growth," Adv. Mater., vol. 13, No. 23, Dec. 2001, pp. 1767-1770.
Zhang, et al., "Formation of Metal Nanowires on Suspended Single-Walled Carbon Nanotubes," Appl. Phys. Ltrs., vol. 77, No. 19, Nov. 2000, pp. 3015-3017.
Zhao, et al., "Frequency-Dependent Electrical Transport in Carbon Nanotubes," Phys. Review B, vol. 64, 2001, pp. 201402-1-201402-4.

* cited by examiner

AQUEOUS CARBON NANOTUBE APPLICATOR LIQUIDS AND METHODS FOR PRODUCING APPLICATOR LIQUIDS THEREOF

CROSS-REFERENCE TO RELATED APPLICATIONS

This application claims the benefit of the earlier filing date of U.S. application Ser. No. 11/304,315, filed Dec. 15, 2005, which claims the benefit under 35 U.S.C. §119(e) of U.S. Provisional Patent Application Nos. 60/636,673, filed Dec. 16, 2004, and 60/704,858, filed Aug. 2, 2005, both of which are assigned to the assignee of this application, and both of which are incorporated herein by reference in their entirety.

This application is related to the following applications, all of which are assigned to the assignee of this application, and all of which are incorporated by reference in their entirety:

Nanotube Films and Articles (U.S. Pat. No. 6,706,402) filed Apr. 23, 2002;

Methods of Nanotube Films and Articles (U.S. Pat. No. 6,835,591) filed Apr. 23, 2002; and Patterning of Nanoscopic Articles (U.S. patent application Ser. No. 10/936,119) filed on Sep. 8, 2004.

BACKGROUND

1. Technical Field

This invention describes applicator liquids for use in the preparation of nanotube films. Such applicator liquids are used in creating films and fabrics of nanotubes or mixtures of nanotubes and other materials on a variety of substrates including silicon, plastics, paper and other materials. In particular, the invention describes applicator liquids containing nanotubes for use in electronics fabrication processes. Furthermore, the applicator liquids meet or exceed specifications for a semiconductor fabrication facility, including a class 1 environment.

2. Discussion of Related Art

Nanotubes are useful for many applications; due to their electrical properties nanotubes may be used as conducting and semi-conducting elements in numerous electronic elements. Single walled carbon nanotubes (SWNTs) have emerged in the last decade as advanced materials exhibiting interesting electrical, mechanical and optical properties. However, the inclusion or incorporation of the SWNT as part of standard microelectronic fabrication process has faced challenges due to a lack of a readily available application method compatible with existing semiconductor equipment and tools and meeting the stringent materials standards required in the electronic fabrication process. Standards for such a method include, but are not limited to, non-toxicity, non-flammability, ready availability in CMOS or electronics grades, substantially free from suspended particles (including but not limited to submicro- and nano-scale particles and aggregates), and compatible with spin coating tracks and other tools currently used by the semiconductor industry.

Individual nanotubes may be used as conducting elements, e.g. as a channel in a transistor, however the placement of millions of catalyst particles and the growth of millions of properly aligned nanotubes of specific length presents serious challenges. U.S. Pat. Nos. 6,643,165 and 6,574,130 describe electromechanical switches using flexible nanotube-based fabrics (nanofabrics) derived from solution-phase coatings of nanotubes in which the nanotubes first are grown, then brought into solution, and applied to substrates at ambient temperatures. Nanotubes may be derivatized in order to facilitate bringing the tubes into solution, however in uses where pristine nanotubes are necessary, it is often difficult to remove the derivatizing agent. Even when removal of the derivatizing agent is not difficult, such removal is an added, time-consuming step.

Generally, until now the solvents used to disperse the carbon nanotubes are organic solvents such as orthodichlorobenzene (ODCB) and chloroform. The solutions are stable but the solvents have the disadvantage of not solubilizing clean carbon nanotubes which are free of amorphous carbon. We have developed a method to remove most of the amorphous carbon and solubilize the carbon nanotubes at high concentrations in water via pH manipulation.

There have been few attempts to disperse SWNTs in aqueous and non-aqueous solvents. Chen et al. first reported solubilization of shortened, end-functionalized SWNTs in solvents such as chloroform, dichloromethane, orthodichlorobenzene (ODCB), $CS_2$, dimethyl formamide (DMF) and tetrahydrofuran (THF). See, "Solution Properties of Single-Walled Nanotubes," Science 1998, 282, 95-98. Ausman et al. reported the use of SWNTs solutions using sonication. The solvents used were N-methylpyrrolidone (NMP), DMF, hexamethylphosphoramide, cyclopentanone, tetramethylene sulfoxide and $\epsilon$-caprolactone (listed in decreasing order of carbon nanotube solvation). Ausman at el. generally conclude that solvents with good Lewis basicity (i.e., availability of a free electron pair without hydrogen donors) are good solvents for SWNTs. See, "Organic Solvent Dispersions of Single-Walled Carbon Nanotubes: Toward Solutions of Pristine Nanotubes," J. Phys. Chem. B 2000, 104, 8911. Other early approaches involved the fluorination or sidewall covalent derivatization of SWNTs with aliphatic and aromatic moieties to improve nanotube solubility. See, e.g., E. T. Mickelson et al., "Solvation of Fluorinated Single-Wall Carbon Nanotubes in Alcohol Solvents," J. Phys. Chem. B 1999, 103, 4318-4322.

Full-length soluble SWNTs can be prepared by ionic functionalization of the SWNT ends dissolved in THF and DMF. See, Chen et al., "Dissolution of Full-Length Single-Walled Carbon Nanotubes," J. Phys. Chem. B 2001, 105, 2525-2528 and J. L. Bahr et al Chem. Comm. 2001, 193-194. Chen et al. used HiPCO™ as-prepared (AP)-SWNTs and studied a wide range of solvents. (HiPCO™ is a trademark of Rice University for SWNTs prepared under high pressure carbon monoxide decomposition). The solutions were made using sonication.

Bahr et al. ("Dissolution Of Small Diameter Single-Wall Carbon Nanotubes In Organic Solvents," Chem. Comm., 2001, 193-194) reported the most favorable solvation results using ODCB, followed by chloroform, methylnaphthalene, bromomethylnaphthalene, NMP and DMF as solvents. Subsequent work has shown that good solubility of AP-SWNT in ODCB is due to sonication induced polymerization of ODCB, which then wraps around SWNTs, essentially producing soluble polymer wrapped (PW)-SWNTs. See Niyogi et al., "Ultrasonic Dispersions of Single-Walled Carbon Nanotubes," J. Phys. Chem. B 2003, 107, 8799-8804. Polymer wrapping usually affects sheet resistance of the SWNT network and may not be appropriate for electronic applications where low sheet resistance is desired. See, e.g., A. Star et al., "Preparation and Properties of Polymer-Wrapped Single-Walled Carbon Nanotubes," Angew. Chem. Int. Ed. 2001, 40, 1721-1725 and M. J. O'Connell et al., "Reversible Water-Solubilization Of Single-Walled Carbon Nanotubes By Polymer Wrapping," Chem. Phys. Lett. 2001, 342, 265-271.

While these approaches were successful in solubilizing the SWNTs in a variety of organic solvents to practically relevant levels, all such attempts resulted in the depletion of the π electrons that are essential to retain interesting electrical and optical properties of nanotubes. Other earlier attempts involve the use of cationic, anionic or non-ionic surfactants to disperse the SWNT in aqueous and non aqueous systems. See, Matarredona et al., "Dispersion of Single-Walled Carbon Nanotubes in Aqueous Solutions of the Anionic Surfactant," J. Phys. Chem. B 2003, 107, 13357-13367. While this type of approach has helped to retain the electrical conductivity and optical properties of the SWNTs, most such methods leave halogens or alkali metals or polymeric residues, which tend to severely hamper any meaningful use in microelectronic fabrication facilities.

SUMMARY OF THE INVENTION

There is a need for a method of distributing nanotubes in a liquid medium for use in electronics applications. Such a method should allow for removal of amorphous carbon, leaving carbon nanotubes, a high concentration of CNTs in solution. Such an applicator liquid could be useful for making high-uniformity nanotube fabrics on various substrates including silicon. The use of such an applicator liquid would require few applications (i.e. spin coat applications), to produce a fabric of controllable sheet resistance with high uniformity. Such an applicator liquid could have many other applications as well.

There remains a further need for methods that meet the criteria outlined above for low toxicity, purity, cleanliness, ease of handling and scalability.

One aspect of the invention is directed to an applicator liquid containing nanotubes and water useful in the preparation of nanotube fabrics and films. According to one aspect of the present invention, an applicator liquid for use in an electronics fabrication process includes an aqueous liquid medium containing a plurality of nanotubes pretreated to reduce the level of metal and particulate impurities to a preselected level. The concentration of the nanotubes in the liquid medium is at commercially meaningful levels, e.g., the nanotubes are at a concentration of greater than 1 mg/L. The nanotubes are homogeneously distributed in the liquid medium without substantial precipitation or flocculation.

In one or more embodiments of the invention, an applicator liquid for preparation of a nanotube film or fabric includes a controlled concentration of nanotubes dispersed in water, wherein the controlled concentration is sufficient to form a nanotube fabric or film of preselected density and uniformity. The nanotubes are at a concentration of greater than 1 mg/L, or greater than 100 mg/L, or greater than 1000 mg/L. The nanotubes are homogeneously distributed in water without precipitation or flocculation.

In one or more embodiments, an applicator liquid for preparation of a nanotube film includes a distribution of nanotubes in water, wherein the nanotubes remain separate from one another without precipitation or flocculation for a time sufficient to apply the applicator liquid to a surface.

In one aspect of the present invention, the applicator solution is substantially free of particulate and metallic impurities. The level of particulate and metallic impurities is commensurate with preselected fabrication requirements.

In another aspect of the invention, a nanotube composition is provided including a plurality of nanotubes in water medium, wherein the nanotubes are substantially separate from one another and homogeneously distributed throughout the water medium.

The fabrication processes can have varying requirements for solvent and raw material composition and purity. According to one aspect of the present invention, applicator solutions of varying composition and purity are provided for use in these fabrication processes having varying processing specifications and environmental requirements.

According to one aspect of the present invention, methods and compositions for creating nanotube applicator solutions for use in fabrication facilities having high standards of non-toxicity and purity are provided. Such processes include semiconductor fabrication processes, for example, CMOS and advanced logic and memory fabrications. Such fabrication processes may produce devices having fine features, e.g., ≤250 nm.

According to other aspects of the present invention, the nanotube applicator solutions are of a purity that is suitable for use in electronics fabrication facilities having less stringent standards for chemical composition and purity. Such processes include, for example, interconnect fabrication and fabrication of chemical and biological sensors.

BRIEF DESCRIPTION OF THE DRAWING

The invention is described with reference to the Drawing, which is presented for the purpose of illustration only and which is not intended to be limiting of the invention.

DETAILED DESCRIPTION OF THE INVENTION

Figure 1:
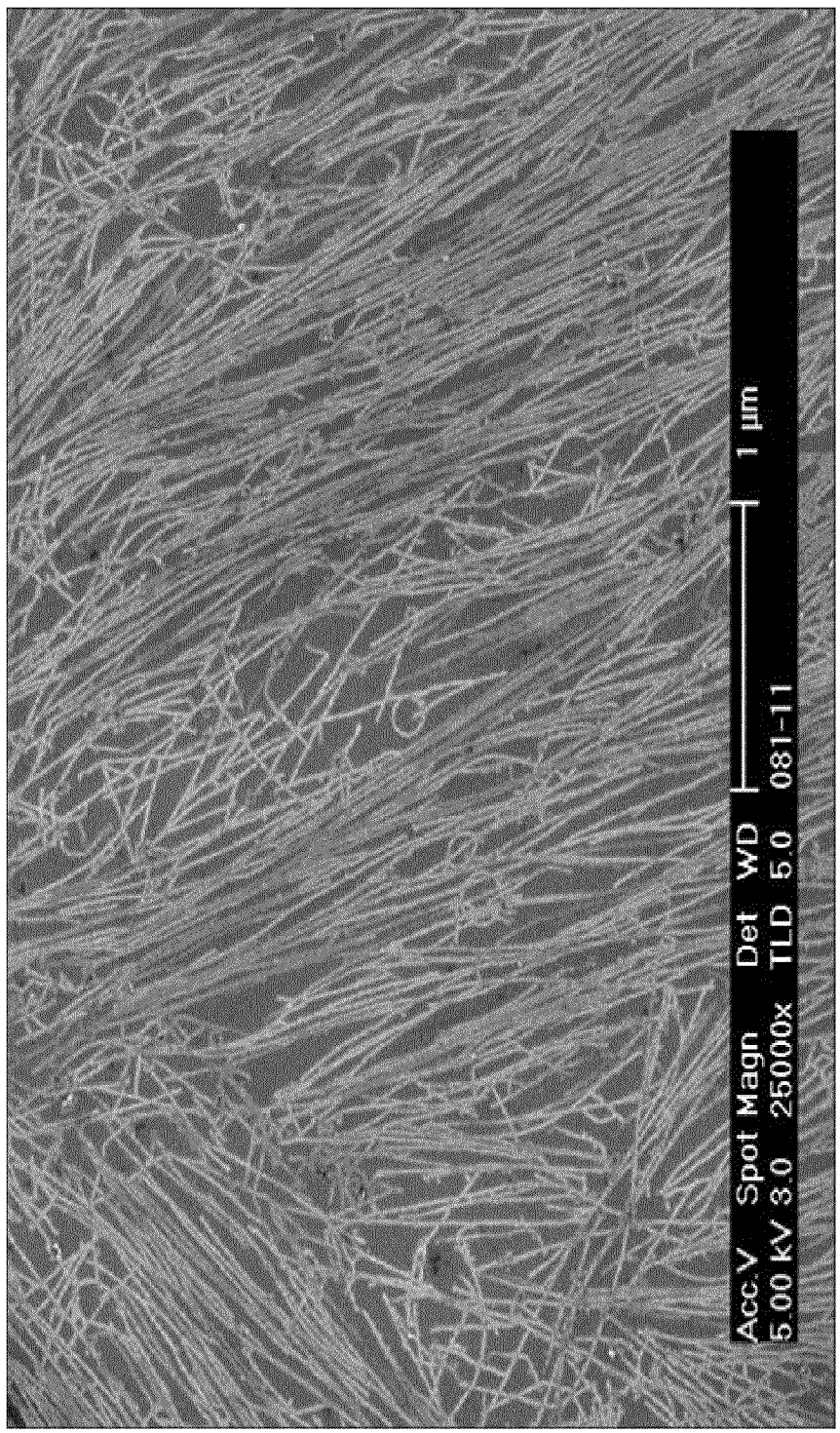
FIG. 1 illustrates a typical scanning electron micrograph (SEM) of a nanotube fabric.

Nanotubes have been the focus of intense research efforts into the development of applications that take advantage of their electronic, biological, and/or material properties. In one or more embodiments, an applicator liquid containing nanotubes is prepared in water. The applicator liquid can be a spin-coatable liquid that may be used to create nanotube films and fabrics of substantially uniform porosity. Certain embodiments provide applicator liquids having a purity level that is commensurate with the intended application. Other applications provide applicator liquids meeting or exceeding specifications for class 1 semiconductor fabrication.

In one or more embodiments, an applicator liquid includes liquid medium containing single-walled nanotubes, multi-walled nanotubes, or mixtures thereof that is stable enough for certain intended applications, such as spin coating in a class 1 production facility. The nanotubes in the applicator liquid remain suspended, dispersed, solvated or mixed in a liquid medium without substantial precipitation, flocculation or any other macroscopic interaction that would interfere with the ability to apply the applicator liquid to a substrate and form a uniform porosity. If there were significant precipitation or aggregation of the nanotubes, the nanotubes would clump together and form non-uniform films, which would be undesirable. The nature by which the nanotubes interact with the liquid medium to form a stable composition is not limited. Thus, for example, the nanotubes may be suspended or dispersed in the liquid medium or they may be solvated or solubilized in the liquid medium. The stable applicator liquid typically forms a homogeneous distribution of nanotubes in the liquid medium.

At the present time, it is desirable that the nanotubes remain distributed in the liquid medium without substantial precipitation, flocculation or other macroscopic interaction, for at least one hour, or for at least 24 hours, or even for at least one week. Substantial precipitation and flocculation and the like can be detected by a variety of methods. Precipitates and aggregates can be detected by visual inspection. Alternatively, precipitation or flocculation can be detected by analytical techniques, such light scattering or absorbance, or by observation of nanotubes once they are deposited on a substrate from the nanotube solution. A stable applicator liquid can exhibit prolonged suspension (typically several weeks to few months) of the SWNT in the medium with little or no detectable change in the scattered light intensity, or absorbance at a given wavelength, or viscosity.

Light scattering is measured using a monochromatic beam of light traveling through the solution. A change of light scattering intensity over time is recorded usually by a detector placed normal to the beam direction or from multiple detectors placed at various angles including the right angle. Another indicator especially at low concentrations of SWNT is the fall in absorbance (at a given wavelength) as a function of time. Other methods of determining the stability of a nanotube applicator liquid for its intended purpose will be apparent to those of skill in the art.

The nanotubes used in one or more embodiments of the present invention may be single walled nanotubes, multi-walled nanotubes, or mixtures thereof and may be of varying lengths. The nanotubes may be conductive, semiconductive or combinations thereof. Both conductive and semiconductive SWNTs are useful in the manufacture of nanotube films, articles and devices and can be used in the nanotube applicator liquid according to one or more embodiments of the invention. Thus, the applicator liquid may be integrated into current electronic fabrication processes including, by way of example, CMOS, bipolar-transistor, advanced memory and logic device, interconnect device, and chemical and biological sensor fabrications.

In selecting a liquid medium for the nanotube composition, the intended application for the applicator liquid may be considered. For example, the liquid medium of the present invention may be an aqueous liquid medium that meets or exceeds purity specifications required in the fabrication of intended application. The semiconductor manufacturing industry demands adherence to the specific standards set within the semiconductor manufacturing industry for ultra-clean, static-safe, controlled humidity storage and processing environments. Many of the common nanotube handling and processing procedures are simply incompatible with the industry standards. Furthermore, process engineers tend to resist trying unfamiliar technologies. According to one aspect of the present invention, a liquid medium for use in the applicator liquid is selected based upon its compatibility or compliance with the electronics and/or semiconductor manufacturing industry standards.

In one aspect of the invention, applicator liquids include a plurality of single-walled nanotubes, multi-walled nanotubes, or mixtures thereof in water as the liquid medium. Water is readily available and accepted into all semiconductor foundries. The water used may be of high purity and may depend or be influenced by the end use application. For example, in CMOS applications the water may be high purity having a typical resistance of about 18 megaohms. Water can be readily purified, creating a particle free and contaminant free liquid. Water will generally not solvate photoresists and is compatible with current and advanced photoresists and lithographic processes.

Typical nanotube concentrations range from about 1 mg/L to 100 g/L, or from about 1 mg/L to 1 g/L, or about 10 mg/L, or about 100 mg/L, or even about 1000 mg/L with a common concentration used for memory and logic applications of 100 mg/L. Such a concentration is exemplary; various useful concentrations ranges depend upon the application. For example in the case where a monolayer fabric is desired, one could use a more diluted concentration with a single or a few applications of the applicator liquid, e.g., by spin coating, to the substrate. In the event that a thick multilayer fabric is desired, a spraying technique could be employed with a nearly saturated composition of nanotube in the applicator liquid. The concentration is, of course, dependent upon the specific liquid medium choice, method of nanotube dispersion and type of nanotube used, e.g., single-walled or multiwalled.

Nanotubes may be prepared using methods that are well known in the art, for example, chemical vapor deposition (CVD) or other vapor phase growth techniques (electric-arc discharge, laser ablation, etc.). Nanotubes of varying purity may also be purchased from several vendors, such as Carbon Nanotubes, Inc., Carbolex, Southwest Nanotechnologies, EliCarb, Nanocyl, Nanolabs, and BuckyUSA (these and other carbon nanotube suppliers are known). Vapor-phase catalysts are typically used to synthesize nanotubes and, as a result, the nanotubes are contaminated with metallic impurities. Furthermore, formation of nanotubes may also be accompanied by the formation of other carbonaceous materials, which are also sources of impurities in the nanotubes.

In one or more embodiments of the present invention, metallic particles and amorphous carbon particles may be separated from nanotubes. The purification process may reduce alkali metal ions, halogen ions, oligomers or polymers as active or inactive chemical components as part of the SWNT solution. The applicator liquids according to certain embodiments of the present invention may be substantially free of high levels of these particulate and/or insoluble materials (as well as other soluble materials that are incompatible with the semiconducting fabrication process). The nanotube solutions may thus be purified for use in CMOS processing or other semiconducting fabrication process.

Appropriate purification techniques may desirably remove impurities without affecting the nanotube chemical structure or electronic properties. Impurities may be removed for example, by dispersing the nanotubes in an acid solution to dissolve metal impurities, followed by separation of the nanotubes from the metallic solution. For example, an acid treatment with nitric acid or hydrochloric acid may be used. The purification technique may further treat the nanotubes with a base. For example, after treatment of the nanotubes with the acid, the nanotubes may further be treated with a base such as $NH_4OH$ (ammonia hydroxide), TMAH (tetramethylammonium hydroxide), or other alkyl ammonium bases. The nanotubes may be treated with an acid and/or a base in a single or multiple steps. In some embodiments, nanotubes may be treated with a concentrated acid and then a mild acid to obtain a dilute acid solution. In some embodiments, the nanotubes may be treated to substantially neutralize a dilute acid solution. For example, a dilute acid solution may be neutralized to have a pH of about 6.5 to 7.5. Other suitable methods for metal removal include magnetic purification.

Without being bound to theory, it may be possible that the acid treatment serves at least a dual function of dissolving the metal impurities and functionalizing the carbon nanotubes with carboxylic acid groups to render them soluble in water. In addition, the acid treatment may further aid in breaking down any amorphous graphitic carbon impurities present in the raw CNT and functionalizing them with carboxylic acid groups as well. One or more additional acid treatment, possibly at weaker acidic conditions than the first acid treatment, may aid in removing metal impurities. The base treatment may lead to a solubility difference between the derivative CNTs and derivatized graphitic carbon, rendering the derivatized amorphous graphitic carbon more soluble in the liquid medium. Such solubility difference may facilitate separation of amorphous graphitic carbon and CNTs via subsequent filtration and/or centrifugation.

Amorphous carbon may be removed, for example, by one or a combination of high speed centrifugation. For example, non-limiting examples of high speed centrifugation techniques may include ultracentrifugation, gravity filtration, cross flow filtration, vacuum filtration and others. Gravity filtration is a procedure wherein the dispersion can be filtered through a membrane under gravitational flow. Cross flow filtration is a procedure where a shearing force normal to the filtration direction can be applied by means of stirring or external, recirculative or non-recirculative pumping. Vacuum filtration is a procedure where the filtrate side of a membrane is subjected to a lower pressure to generate a differential pressure as a driving force for filtration.

Alternatively, particulate may be removed from the applicator liquids by using continuous flow centrifuge at g forces between 60000-180000 and adequate flow rates. The usage of continuous flow centrifuge may lead to higher quality products, reduced manufacturing time, and can be less labor intensive. Continuous flow centrifugation refers to a method to separate or sediment particulate solids form a solution or suspension using centrifugal force applied with a continuous flow centrifuge. The continuous flow centrifuge may allow for particulate separation or removal from a solution in a continuous mode of operation of the centrifuge. Any commercially available "high-g" centrifuges or ultracentrifuges may be utilized. The continuous flow centrifuge may have the ability to separate particles from solution by continuously feeding the solution to the centrifuge rotor, followed by particles separation or sedimentation, and continuous removal of the particulate free product from the centrifuge rotor. For example, lab scale continuous flow ultracentrifuges (that are capable of generating up to 10 L of particulate free product in one hour) or manufacturing scale continuous flow centrifuges (that are capable of generating to 100 L particulate free product in one hour) may be utilized. A non-limiting example of a lab scale continuous flow ultracentrifuge may be the Sorvall Discovery 90/100 with TCF32 rotor. A non-limiting example of a manufacturing scale continuous flow ultracentrifuge may be the Sorvall CC40 or CC40S.

Yet other suitable purification techniques include the preferential oxidation of non-fullerenic carbonaceous materials. The amorphous carbon as part of the original raw CNT soot or the graphitic shell carbon that encases the catalyst metal nanoparticles can also be oxidized in an oxidation step prior to the acid treatment. This step called a pre-oxidation step and can be conducted as a gas-solid reaction which may include water vapor along with an oxidative gas, such as air or oxygen, or in dry oxidative ambient in the absence of water.

Multiple purification steps may be desired in order to obtain nanotubes of a purity appropriate for use in a CMOS-grade nanotube solution. See, for example, Chiang, et al., J. Phys. ChemB 105, 1157 (2001); and Haddon, et al., MRS Bulletin, April 2004).

In one or more embodiments, nanotubes can be pretreated to reduce the metallic impurity levels to preselected levels. In certain embodiments, the applicator liquid of the present invention may consists of less than 500 parts per billion (ppb), or less than about 200 ppb, or less than about 50 ppb, or less than about 25 ppb of trace metal impurities. Applicator liquids of the present invention may be used in the manufacture in CMOS compatible foundries of advanced electronic devices with finer features. For example, devices having fine features may be devices having features of less than or equal to 250 nm in size.

Heavy metals, for example, metals having a specific gravity of greater than about 5 g/ml, are generally toxic in relatively low concentrations to plant and animal life and tend to accumulate in the food chain. Examples include lead, mercury, cadmium, chromium, and arsenic. Such compounds are carefully regulated in the semiconductor fabrication industry and are desirably maintained at minimum levels. In one or more embodiments, the applicator liquids of the present invention, when placed on a surface, may include less than about 500 ppb, or less than about 200 ppb, or less than about 50 ppb, or less than about 25 ppb, or about 0.1 to 10 ppb of trace heavy metal impurities.

Similarly, the concentration of group I and group II elements is regulated due to the deleterious effect of elements such as sodium, potassium, magnesium and calcium, and the like, on the performance characteristics of the electronic device. In one or more embodiments, the applicator liquids of the present invention, when placed on a surface, may include less than about 500 ppb, or less than about 200 ppb, or less than about 50 ppb, or less than about 25 ppb, or about 1 to 25 ppb of trace alkali (group I element) and alkaline earth (group II element) impurities.

Transition metals may also be avoided due to their ready migration and the deleterious effect that such migration has on the device performance. See, Mayer, et al. Electronic Materials Science: For Integrated Circuits in Si and GaAs, 2nd Ed, Macmilliam, New York, 1988. As is the case for heavy metals and group I and group II metals, it may be desirable to maintain the impurity level of transition metals, such as copper, iron, cobalt, molybdenum, titanium and nickel, to less than preselected values. In one or more embodiments of the present invention, the applicator liquids of the present invention, when placed on a surface, may include less than about 500 ppb, or less than about 200 ppb, or less than about 50 ppb, or less than about 25 ppb, or about 0.1 to 10 ppb of transition metal impurities.

For example, the Roadmap for Semiconductors (ITRS Roadmap) states that at the 65 nm DRAM half-pitch mode, the critical particle size is 33 nm and only 1 particle/m$^3$ is allowed over the critical size. From the ITRS 2002 update, at the 90 nm DRAM half-pitch mode, the critical particle size is 45 nm with only two particles/m$^3$ allowed above the critical particle dimension. The ITRS Roadmap for 90 nm DRAM half-pitch mode allows for <15×10$^{10}$ atoms/cm$^3$ of metal contamination during fabrication. Liquid chemicals utilized for wafer fabrication may contribute <10 particles/mL of surface contamination. Other fabrication specifications may be identified by the ITRS.

The semiconductor industry has well-established testing protocols for monitoring the particulate levels at, for example, 5 μm, 3 μm, 1 μm, 500 nm, 300 nm and 100 nm. The metrology employed for detecting the particulate contaminate will have a resolution of 0.2 nm. Typical equipment include KLA Tencor Surfscan™ and the like. Such testing methods and equipment may be readily adapted for use in evaluating the particulate levels of nanotube compositions.

In one or more embodiments of the present invention, the applicator liquids may be aqueous, homogeneous mixture of purified single walled carbon nanotubes at concentrations high enough to be useful in practical applications in the electronics industry, e.g., ≥10 mg/L. The applicator liquids can be electronics-grade purity. In some embodiments, nanotubes purified to an impurity content of less than 0.2 wt %, or less than 0.1 wt % free metal may be solubilized in pH-controlled water.

It has been surprisingly discovered that nanotubes that have been pretreated to reduce the metallic and particulate impurity levels to below preselected levels, such as described herein, can form stable nanotube dispersions in water. One or more steps of grinding or agitating the nanotubes in the selected solvent and sonication may enhance homogeneity.

The applicator liquids of the present invention can be appropriate for use as a spin-on SWNT solution for electronic and electronic packaging applications. The addition of various optional additives may be useful to facilitate long term storage and stabilization properties of carbon nanotube applicator liquids. Such additives include, but are not limited to stabilizers, surfactants and other chemicals known or accepted as additives to solutions used for fabrication of electronics. However, the applicator liquids of the present invention may also be free or substantially free of additional additives.

The applicator liquids according to one or more embodiments of the present invention and the methods of making the applicator liquids of nanotubes have been standardized for CMOS compatibility as required in conventional semiconductor fabrication systems, i.e. the chemicals, spin coating tracks and other related machineries necessary to create the solutions of the present invention may be found in typical CMOS processing facilities or more generally may be present in many types of services common to the electronics industry including fabrication and packaging facilities.

Figure 2:
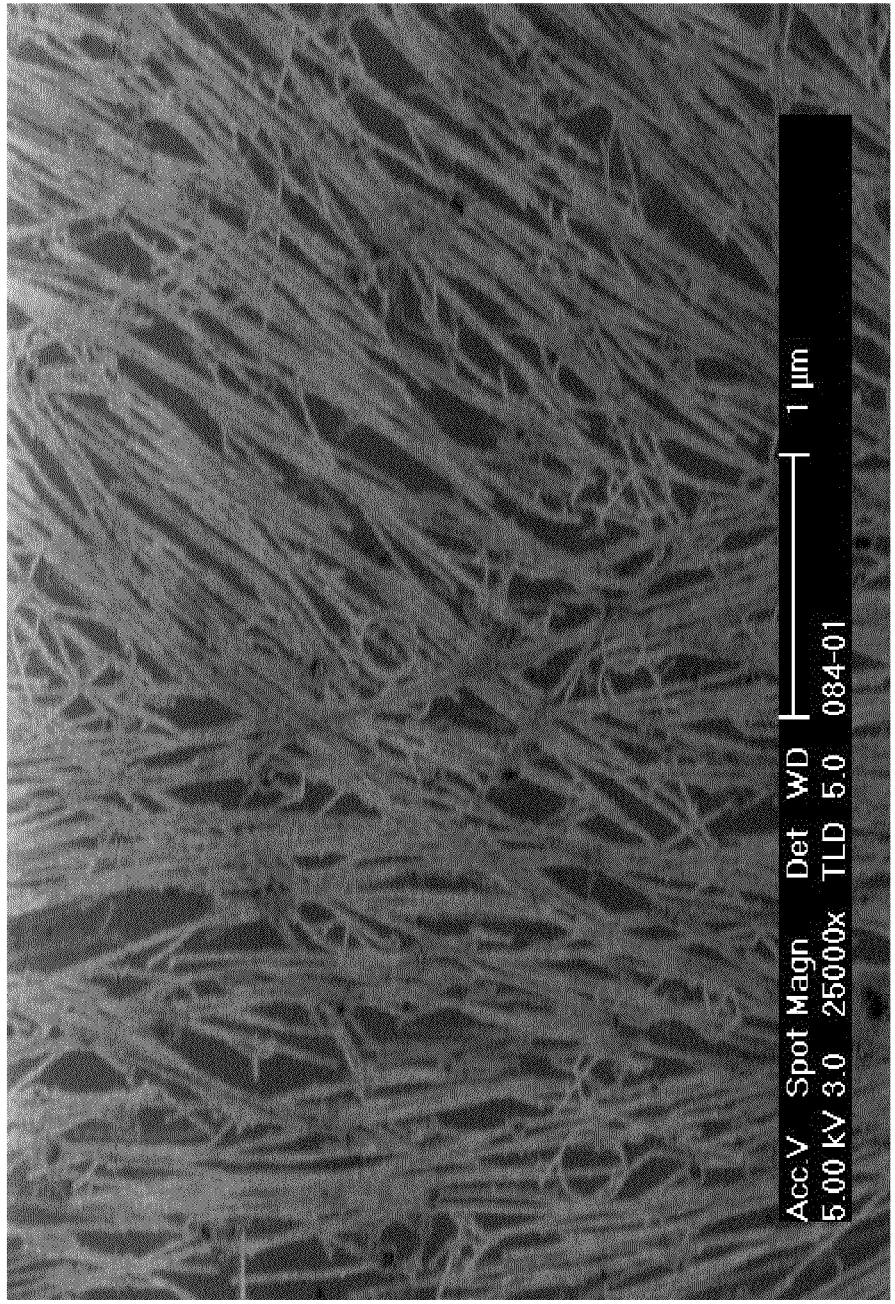
FIG. 2 illustrates a typical micrograph of a purified nanotube fabric.

The applicator liquid can be placed or applied on a substrate to obtain a nanotube film, fabric or other article. A conductive article includes an aggregate of nanotubes (at least some of which are conductive), in which the nanotubes contact other nanotubes to define a plurality of conductive pathways in the article. The nanotube fabric or film desirably has a uniform porosity or density; in many applications, it is a monolayer. FIGS. 1 and 2 are micrographs of fabrics made from water soluble nanotubes spun onto a substrate.

A semiconductive article comprising semiconducting nanotubes includes an aggregate of semiconducting nanotubes in which the nanotubes contact other nanotubes to define a plurality of semiconductive pathways in the article. The nanotube fabric or film desirably has a uniform porosity or density: in many applications, it is a monolayer. Such a semiconductive fabric may be used as an element in a field effect transmitter, e.g. for use as a channel.

Many methods exist for the application procedure including spin coating, spray coating, coating, dipping and many others known for dispersing solutions onto substrates. For thicker fabrics beyond a monolayer, more applications or more concentrated solutions may be required. In fact other techniques for application of the applicator liquid onto a suitable substrate may be required as has been outlined elsewhere (See Nanotube Films and Articles (U.S. Pat. No. 6,706,402) filed Apr. 23, 2002 and Methods of Nanotube Films and Articles (U.S. patent application Ser. No. 10/128,117) filed Apr. 23, 2002, both of which are hereby incorporated by reference herein in their entirety).

In one or more embodiments, the nanotube film, fabric or other article may contain less than about $10^{18}$ atoms/cm$^2$ of metal impurities, or less than about $10^{16}$ atoms/cm$^2$ of metal impurities, or less than about $10^{14}$ atoms/cm$^2$ of metal impurities, or less than about $10^{12}$ atoms/cm$^2$ of metal impurities, or less than about $10^{10}$ atoms/cm$^2$ of metal impurities. Nanotube film, fabric or other article having lower levels of metallic impurities, for example, $10^{10}$-$10^{12}$ atoms/cm$^2$, may be used in the manufacture of advanced devices having fine features. For example, devices having fine features may be devices having features of less than or equal to 250 nm.

In one or more embodiments, the nanotube film, fabric or other article may include less than about $10^{18}$ atoms/cm$^2$ of heavy metal impurities, or less than about $10^{16}$ atoms/cm$^2$ of heavy metal impurities, or less than about $10^{14}$ atoms/cm$^2$ of heavy metal impurities, or less than about $10^{12}$ atoms/cm$^2$ of heavy metal impurities or even less than about $15 \times 10^{10}$ atoms/cm$^2$ of heavy metal impurities.

In one or more embodiments, the nanotube film, fabric or other article may include less than about $10^{18}$ atoms/cm$^2$ of group I and group II element impurities, or less than about $10^{16}$ atoms/cm$^2$ of group I and group II element impurities, or less than about $10^{14}$ atoms/cm$^2$ of group I and group II element impurities, or less than about $10^{12}$ atoms/cm$^2$ of group I and group II element impurities or even less than about $15 \times 10^{10}$ atoms/cm$^2$ of group I and group II element impurities.

As is the case for heavy metals and group I and group II metals, it may be desirable to maintain the impurity level of transition metals, such as copper, iron, cobalt, molybdenum, titanium and nickel, to less than preselected values. In one or more embodiments of the present invention, the nanotube film, fabric or other article may include less than about $10^{18}$ atoms/cm$^2$ of transition metal impurities, or less than about $10^{16}$ atoms/cm$^2$ of transition metal impurities, or less than about $10^{14}$ atoms/cm$^2$ of transition metal impurities, or less than about $10^{12}$ atoms/cm$^2$ of transition metal impurities or even less than about $15 \times 10^{10}$ atoms/cm$^2$ of transition metal impurities.

The use of the term "about" reflects the variation that occurs in measurement and can range up to 30% of the measured value. For example, when determining metal impurity levels using VPD ICP-MS, the accuracy of the measurement is related to the precision of analytical signals, the recovery of trace metals from the wafer surface, and the accuracy of the standards used. Overall accuracy of the VPD ICP-MS technique varies from ±15%, at concentration levels higher than 10 times above the method detection limit, to ±30% or higher at concentration levels lower than 10 times the detection limits. Similar variability is expected in other measurements.

The following examples are provided to illustrate the invention, which is not intended to be limiting of the invention, the scope of which is set forth in the claims which follow.

EXAMPLE 1

This example describes the purification of nanotubes.

Single-walled carbon nanotubes (SWNTs) were purified by mixing 1 g of carbon nanotubes with a 125 mL:125 mL mixture of 15 M nitric acid (HNO$_3$):DI water. The nanotube: nitric acid:DI mixture was stirred for 8 hours and refluxed for 12 hours at 125° C. After purification, the 250 mL nanotube: nitric acid solution was diluted with 7 parts DI water (~1.8 L). The pH of the solution was adjusted to 1.5±0.1 by dropwise addition of concentrated NH$_4$OH ([c]~35%). The solution was then sonicated for 60 minutes in a chilled sonication bath at 4-5° C. Once sonication was completed, cross-flow filtration was then performed with a dedicated 0.5 micron ceramic membrane. The filtration was performed until the liquid that passes through the pores of the filter membrane obtained a pH of 4.0. This liquid is called a permeate and was rejected. The liquid that does not pass through the pores of the filter membrane is called a retentate and was recovered. The pH of the retentate was then re-adjusted to 7.1 by adding a low (0.1% w/V) concentration of $NH_4OH$ to the liquid. The liquid was then sonicated again for 2 hours in a 4-5° C. sonication bath. The liquid was then allowed to soak for another 2 hours. The resulting applicator liquid was then qualified by spin coating the solution onto a desired non-conducting substrate such as silicon dioxide. The applicator liquid was spin-coated on the substrate by applying 4-6 mL of aqueous solution to a 100 mm diameter silicon dioxide substrate. The applicator liquid dispensed on the substrate was first spun at 60 rpm for 20 seconds, followed by a 1 second 500 rpm spin, a 180 second 60 rpm spin and a 20 second 2000 rpm spin to dry the wafer. After a single coating, a sheet resistance of 1.3-1.4 k$\Omega$/sq was produced on the substrate.

To remove the amorphous carbon and other small particles, another cross flow filtration process was performed. An initial liquid metric was taken by measuring the optical density of the solution. At this stage the optical density of the liquid was about 0.5-4.0 at a wavelength of 550 nm. The cross flow filtration was performed until the permeate's optical density was about 0.012±0.005. After filtration, the liquid was soaked for 12 hours, followed by another sonication for 2 hours in a chilled 4-5° C. bath. Another liquid qualification was performed after this step to verify the conductivity of a resulting spun-on fabric. Employing the same spin procedure as above, a fabric having a surface resistance of 5-10 k$\Omega$/sq is produced. Centrifugation was then performed to remove the larger particles (molecular weight species) in the liquid. An initial centrifugation step was performed at 25,000 rpm for 2 hours. The remaining liquid was then manually (by hand) transferred from the centrifugation vial into another vial. The sediment was discarded. A second centrifugation step was then performed at 25,000 rpm for 75 minutes. To ensure that there was no contamination of the solution after this centrifugation step, the liquid was transferred to an adequate container through a pump process, avoiding any possible human contamination or other extraneous contaminants. A final liquid qualification was performed by another spin coating process. Repeating the same spin-coating process as above, a fabric with a sheet resistance of 4-5 k$\Omega$/sq was produced on a silicon dioxide wafer after one spin coat.

The applicator liquid produced herein can be used to form a component of NRAM memories, such as described in U.S. Pat. No. 6,919,592, entitled "Electromechanical Memory Array Using Nanotube Ribbons and Method for Making Same," filed Jul. 25, 2001; U.S. Pat. No. 6,643,165, entitled "Electromechanical Memory Having Cell Selection Circuitry Constructed with Nanotube Technology," filed Jul. 25, 2001; U.S. patent application Ser. No. 10/810,962, entitled "NRAM Bit Selectable Two-Drive Nanotube Array," filed Mar. 26, 2004; and U.S. patent application Ser. No. 10/810,963, entitled "NRAM Byte/Block Released Bit Selectable One-Device Nanotube Array," filed Mar. 26, 2004. The solution holds potential as a stand-alone commercial product to serve the research and development laboratories that work on single-walled carbon nanotubes as well other applications.

In order to avoid recontamination of the nanotubes, clean room conditions, for example, Class 100 or greater, were maintained during preparation and processing of the applicator liquid.

EXAMPLE 2

In addition to the examples given above, various pre-oxidation schemes were also used to purify the carbon nanotubes. Without being bound to theory, pre-oxidation process may remove amorphous carbon impurities and also may crack open the graphitic shells that cover the metal catalysts, thereby rendering them accessible to subsequent acid treatment.

In one example, carbon nanotubes were purified by mixing 1 g of carbon nanotubes with 100 mL of 30% $H_2O_2$. The nanotube: hydrogen peroxide was refluxed for 3 h at 110° C. After the pre-oxidation step, the 100 mL nanotube:peroxide solution was diluted with 10 parts DI water (~1 L). The nanotube:peroxide:DI water slurry was sonicated for 60 minutes in a chilled sonication bath at 4-5° C. The slurry was then vacuum filtered over 5 micron Teflon filter membrane. The solid was collected from the top of the filter membrane and taken through the next processing steps, as described below.

After the pre-oxidation step described above, the material was refluxed in microelectronics grade nitric acid. The concentration of the nitric acid, the reflux time and temperature were optimized based on the starting CNT material. For example, CNTs were refluxed in concentrated nitric acid (15M) at 125° C. for 24 h. After the nitric acid reflux step, the CNT suspension in acid was diluted in 0.35% nitric acid solution (~2 L) and taken through several passes of cross-flow filtration (CFF). First few passes of CFF (hereinafter called CFF1) may remove the acid and soluble metal salts in the suspension. The pH of the suspension during the CFF1 steps was maintained at 1±0.3 by recovering the material in 0.35% nitric acid after each step. Typically five CFF1 steps were performed. After the CFF1 steps, the retentate was collected in DI water and the pH of the nanotube:DI water suspension was increased to 9±0.2 with ammonium hydroxide (concentration 29%) and sonicated. The CNT suspension in DI water was rendered into an optically transparent liquid. This liquid was taken through another set of CFF passes (hereinafter referred as CFF2). CFF2 may remove the amorphous carbon impurities in the solution. CFF2 was performed until optical density of the permeate was about 0.012±0.005. After the CFF2 process, the retentate was collected in DI water and the pH of the nanotube:DI water liquid was adjusted to pH 8±0.2 and the solution was sonicated for 120 minutes in a chilled sonicator bath (4-5° C.). Finally, the solution was centrifuged about three times at about 70000 g for about 1 h. In certain cases, the pH of the solution was adjusted to 8±0.2 in between the centrifugation passes which may remove residual metal or carbon nanoparticles in the liquid by sedimentation. After the centrifugation step, the supernatant was collected and used as the final CMOS grade applicator liquid.

The applicator liquid produced herein can also be used to form a component of NRAM memories, such as described in U.S. Pat. No. 6,919,592, entitled "Electromechanical Memory Array Using Nanotube Ribbons and Method for Making Same," filed Jul. 25, 2001; U.S. Pat. No. 6,643,165, entitled "Electromechanical Memory Having Cell Selection Circuitry Constructed with Nanotube Technology," filed Jul. 25, 2001; U.S. patent application Ser. No. 10/810,962, entitled "NRAM Bit Selectable Two-Drive Nanotube Array," filed Mar. 26, 2004; and U.S. patent application Ser. No. 10/810,963, entitled "NRAM Byte/Block Released Bit Selectable One-Device Nanotube Array," filed Mar. 26, 2004. The solution holds potential as a stand-alone commercial product to serve the research and development laboratories that work on single-walled carbon nanotubes as well other applications.

In order to avoid recontamination of the nanotubes, clean room conditions, for example, Class 100 or greater, were maintained during preparation and processing of the applicator liquid.

EXAMPLE 3

This example describes a gas phase pre-oxidation of carbon nanotubes. For example, 1 g of carbon nanotubes were heated in a flow of nitrogen-oxygen mixture (2:1 ratio) at 350° C. for 12 h. The gas-phase pre-oxidized carbon nanotube material was taken through the nitric acid treatment, cross flow filtration and centrifugation steps as described in Example 2 to produce an applicator liquid.

The applicator liquid produced herein can also be used to form a component of NRAM memories, such as described in U.S. Pat. No. 6,919,592, entitled "Electromechanical Memory Array Using Nanotube Ribbons and Method for Making Same," filed Jul. 25, 2001; U.S. Pat. No. 6,643,165, entitled "Electromechanical Memory Having Cell Selection Circuitry Constructed with Nanotube Technology," filed Jul. 25, 2001; U.S. patent application Ser. No. 10/810,962, entitled "NRAM Bit Selectable Two-Drive Nanotube Array," filed Mar. 26, 2004; and U.S. patent application Ser. No. 10/810,963, entitled "NRAM Byte/Block Released Bit Selectable One-Device Nanotube Array," filed Mar. 26, 2004. The solution holds potential as a stand-alone commercial product to serve the research and development laboratories that work on single-walled carbon nanotubes as well other applications.

In order to avoid recontamination of the nanotubes, clean room conditions, for example, Class 100 or greater, were maintained during preparation and processing of the applicator liquid.

EXAMPLE 4

In this example, 0.3 g of single-walled carbon nanotubes were heated in moist gas at 250° C. for 12 h by bubbling the nitrogen-oxygen mixture through a water bubbler. The water bubbler can be maintained at any temperature from room temperature up to about 80° C. The pre-oxidized carbon nanotube material was taken through the nitric acid treatment, cross flow filtration and centrifugation steps as described in Example 2 to produce an applicator liquid.

The liquid applicator produced herein can also be used to form a component of NRAM memories, such as described in U.S. Pat. No. 6,919,592, entitled "Electromechanical Memory Array Using Nanotube Ribbons and Method for Making Same," filed Jul. 25, 2001; U.S. Pat. No. 6,643,165, entitled "Electromechanical Memory Having Cell Selection Circuitry Constructed with Nanotube Technology," filed Jul. 25, 2001; U.S. patent application Ser. No. 10/810,962, entitled "NRAM Bit Selectable Two-Drive Nanotube Array," filed Mar. 26, 2004; and U.S. patent application Ser. No. 10/810,963, entitled "NRAM Byte/Block Released Bit Selectable One-Device Nanotube Array," filed Mar. 26, 2004. The solution holds potential as a stand-alone commercial product to serve the research and development laboratories that work on single-walled carbon nanotubes as well other applications.

In order to avoid recontamination of the nanotubes, clean room conditions, for example, Class 100 or greater, were maintained during preparation and processing of the liquid applicator.

EXAMPLE 5

In this example, 3 g of carbon nanotubes were mixed with 180 mL of concentrated sulfuric acid and 60 mL of concentrated nitric acid. The mixture was sonicated for 1 h in a chilled sonicator bath (4-5° C.).

After this pre-oxidation step the nanotube:acid slurry was filtered and the solid material was mixed with 150 mL 30% $H_2O_2$ and 150 mL DI water. The pre-oxidized nanotube:peroxide:DI water mixture was refluxed at 100° C. for 3 h. After the second pre-oxidation step, the 300 mL nanotube:peroxide solution was diluted with 6 parts DI water (~1 L). The nanotube:peroxide:DI water slurry was sonicated for 60 minutes in a chilled sonication bath at 4-5° C. The slurry was then vacuum filtered over 5 micron Teflon filter membrane. The solid was collected from the top of the filter membrane and taken through the nitric acid treatment, cross flow filtration and centrifugation steps as described in Example 2 to produce an applicator liquid.

The applicator liquid produced herein can also be used to form a component of NRAM memories, such as described in U.S. Pat. No. 6,919,592, entitled "Electromechanical Memory Array Using Nanotube Ribbons and Method for Making Same," filed Jul. 25, 2001; U.S. Pat. No. 6,643,165, entitled "Electromechanical Memory Having Cell Selection Circuitry Constructed with Nanotube Technology," filed Jul. 25, 2001; U.S. patent application Ser. No. 10/810,962, entitled "NRAM Bit Selectable Two-Drive Nanotube Array," filed Mar. 26, 2004; and U.S. patent application Ser. No. 10/810,963, entitled "NRAM Byte/Block Released Bit Selectable One-Device Nanotube Array," filed Mar. 26, 2004. The solution holds potential as a stand-alone commercial product to serve the research and development laboratories that work on single-walled carbon nanotubes as well other applications.

In order to avoid recontamination of the nanotubes, clean room conditions, for example, Class 100 or greater, were maintained during preparation and processing of the applicator liquid.

Materials and Equipment:

All the materials such as reaction vessels, sonication flasks, reflux condensers and collection vessels were fabricated out of low alkali quartzware in order to produce CMOS grade carbon nanotube solution. Without being bound to theory, this factor may be important because refluxing strong acids such as nitric acid in ordinary glassware introduces alkali metal impurities due to leaching of these metals from the vessels. Nantero, Inc., the assignee of the present application, has generated data showing that refluxing concentrated nitric acid in low alkali quartzware do not introduce any alkali metal impurities. Another factor relating to equipment may be the use of O-ring joints for the reaction vessels that can withstand aggressive acid environment as well as high temperatures.

Chemicals:

All chemicals used in the process, such as nitric acid, hydrogen peroxide, ammonium hydroxide and sulfuric acid are microelectronics grade. For example, Finyte grade chemicals from JTBaker can be used.

CFF Membranes:

The ceramic membranes used for filtration are alpha-phased alumina with a pore size of about 0.1 to 12 micron. Preferably, membranes with pore size of 0.3 to 5 micron, or even more preferably, membranes with pore size of 0.4 to 1.5 micron can be used. The ceramic membranes are chemically stable at pH of 0 to 14 and the amount of metals leached in the working conditions are minimal, preferably less than 50 ppb, and even more preferably less than 10 ppb. Moreover, the membranes can be encased in a material which will substantially be chemically inert during the processing. The ceramic membranes can provide the necessary surface area for an efficient filtration of about 19-37 channels, internal diameter of each channels of about 3, 4, or 6 mm, and lengths of each channels ranging from about 0.1 to 10 m. The ceramic membranes can be used one by one or can be used as modules of multiple membranes as required by the scale of production.

Comparative Centrifugation

Figure 3B:
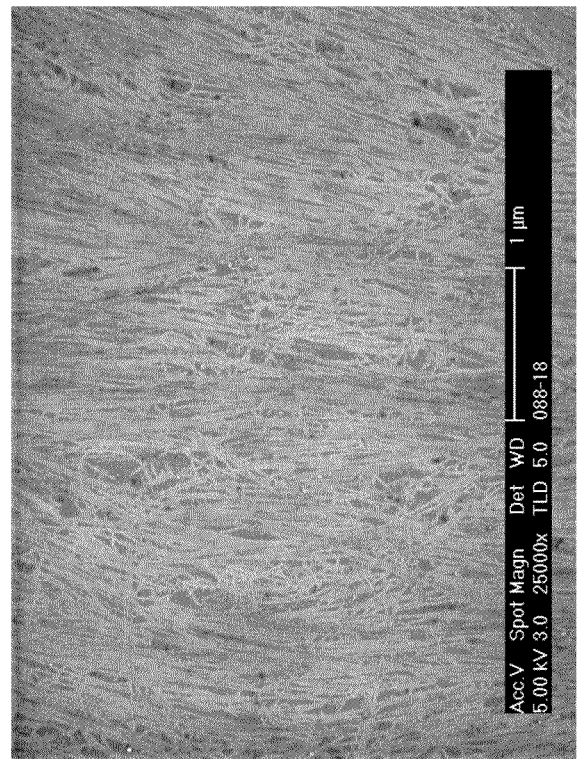
FIG. 3B illustrates a micrograph of the nanotube fabric of FIG. 3A at higher magnification.
Figure 3A:
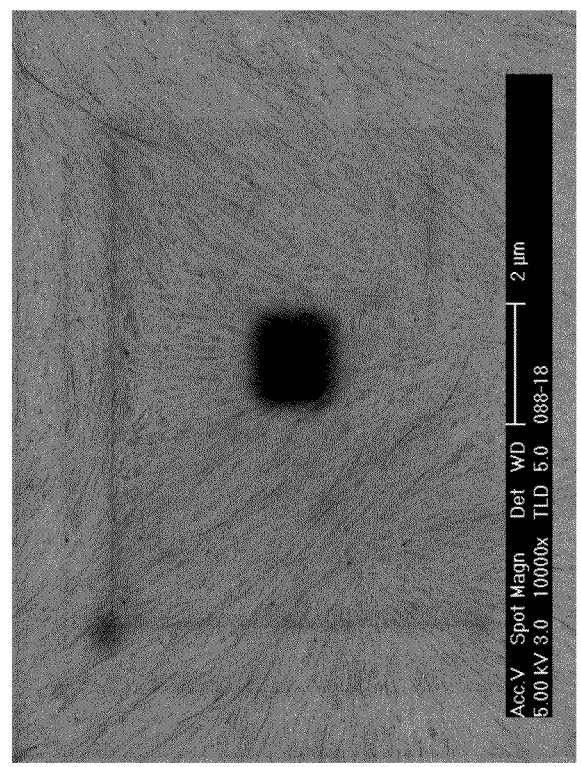
FIG. 3A illustrates a micrograph of a nanotube fabric created with batch centrifugation.

Nanotubes were centrifuged in two different procedures with all other parameters kept the same. First, nanotubes were subjected to batch centrifugation in a Beckman centrifuge at 25,000 rpm (equivalent to 75,600 g); total centrifugation time 3 h. The resulting solution resulted in absorption of OD=3.167 at 550 nm; a monolayer film made of the nanotubes from this solution exhibited resistance values of 5 to 9 kohm. FIG. 3A is a micrograph of a fabric of nanotubes created with batch centrifugation and FIG. 3B is a micrograph of the same fabric at higher magnification.

Figure 4B:
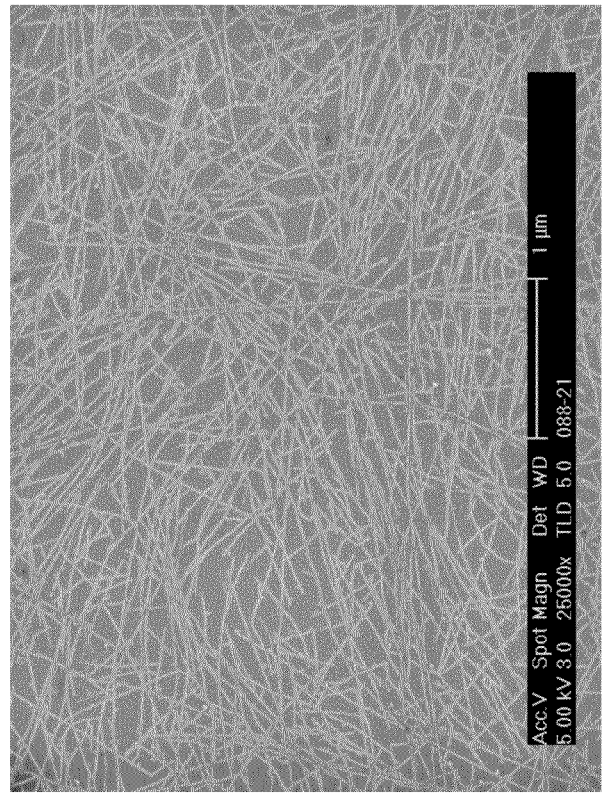
FIG. 4B illustrates a micrograph of the nanotube fabric of FIG. 4A at higher magnification.
Figure 4A:
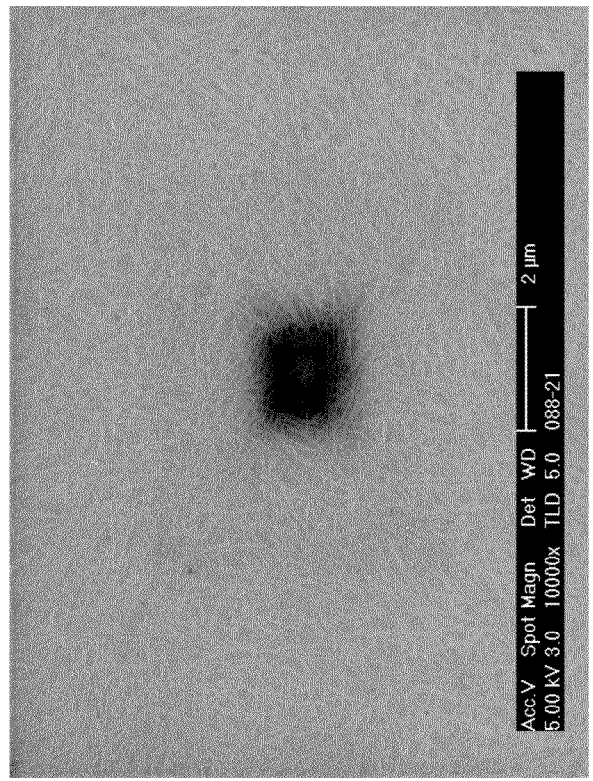
FIG. 4A illustrates a micrograph of a nanotube fabric created with continuous flow centrifugation.

Next, nanotubes were subjected to continuous flow centrifugation in a Sorvall Discovery 90 centrifuge with a continuous flow rotor at 26,100 rpm equivalent to the same g force as for the batch centrifuge; the flow rate of the feed was set at a value to allow for the same residence time in the continuous flow rotor as in the batch rotor. The resulting solution resulted in absorption of OD=1.615 at 550 nm; a monolayer film made of the nanotubes from this solution exhibited resistance values of 6.5 to 8 kohm. The solution centrifuged in the continuous mode led to cleaner material, necessitating less processing time, contained less amorphous carbon, and the fabric obtained exhibited lower resistance at the same solid concentration. FIG. 4A is a micrograph of a fabric of nanotubes created with continuous flow centrifugation and FIG. 4B is a micrograph of the same fabric at higher magnification. Observation of FIGS. 3A and B and 4A and B show, to the naked eye, that continuous flow centrifugation leads to cleaner solution.

Other Embodiments

In alternate embodiments of the present invention, each individual step of the solubilization process is detailed in the above examples for the solubilization of SWNTs in water. It should be noted that CNTs and SWNTs can be used interchangeably in all of the methods described herein. Many other methods of forming such an applicator liquid are possible by adding or subtracting steps involving agitation and solubilization depending upon the specific requirements for concentration, solution stability and ultimate performance metrics of the desired fabric.

Moreover, the applicator liquids of the present invention need not necessarily be homogeneously distributed in a liquid medium containing water, or containing substantially water, or even containing only water. For example, the liquid medium contain or be predominantly organic solvents such as ethyl lactate, dimethyl sulfoxide (DMSO), monomethyl ether, 4-methyl-2 pentanone, N-methylpyrrolidone (NMP), t-butyl alcohol, methoxy propanol, propylene glycol, ethylene glycol, gamma-butyrolactone, benzyl benzoate, salicylaldehyde, tetramethyl ammonium hydroxide, and esters of alpha-hydroxy carboxylic acids. In other embodiments, the liquid medium may contain or be predominantly a non-halogenated solvent.

In certain embodiments, concentrations of metallic or carbonaceous contamination that are above those required for CMOS fabrication may be acceptable. The present invention serves to exemplify creation of nanotube applicator liquids with stringent requirements that meet or exceed those of a CMOS process flow but can be modified in applications that have relaxed requirements.

In certain embodiments the concentration of SWNT in the applicator liquid may be modified or tailored to form thick nanotube coatings up to 100 microns thick or more and as thin as a monolayer of SWNTs. Such nanotube fabrics can be characterized by resistivity or capacitance measurements to meet the requirements of the specific electronics application.

As described herein, certain applicator liquids and application techniques are described, which can be used to form nanotube films or fabrics of controlled properties. For example, certain proposals have been made suggesting the benefits of substantially monolayers of nanotubes with substantially uniform porosity. Techniques have been provided in which one or more parameters may be controlled or monitored to create such films. Moreover, these liquids are intended for industrial environments, which require that the liquids be usable, i.e. that the nanotube suspension is stable, for periods of days, weeks and even months.

What is claimed are:

1. A method for making an applicator liquid, the method comprising:
    purifying a plurality of nanotubes to obtain purified nanotubes, wherein said step of purifying is accomplished by:
    contacting said plurality of nanotubes with an acid to create a nanotube-acid solution and dissolve metal impurities,
    separating the dissolved metal impurities from said nanotube-acid solution to obtain said purified nanotubes in said nanotube-acid solution, and
    contacting said plurality of nanotubes in the nanotube-acid solution with a base to return the pH level of the nanotube-acid solution to approximately neutral to obtain purified nanotubes; and
    contacting said purified nanotubes with water; wherein
    said applicator liquid contains said purified nanotubes distributed in said water without substantial precipitation for at least one hour after said contacting;
    said applicator liquid is free of polymers and surfactants; and
    said applicator liquid has a group I metal impurities content of less than 100 ppb.

2. The method of claim 1, wherein said acid is a nitric acid, a hydrochloric acid, or a mixture thereof.

3. The method of claim 1, wherein said base is an ammonia hydroxide, tetramethylammonium hydroxide, alkyl ammonium bases, or combinations thereof.

4. The method of claim 1, wherein said contacting said plurality of nanotubes with a base reduces amorphous carbon impurities.

5. The method of claim 1, wherein said applicator liquid is substantially free of amorphous carbon impurities.

6. The method of claim 1, wherein said step of separating said dissolved metal impurities comprises removing said dissolved metal impurities using centrifugation.

7. The method of claim 6, wherein said centrifugation comprises ultracentrifugation, continuous flow centrifugation, or combinations thereof.

8. The method of claim 1, wherein said purifying comprises oxidizing non-fullerenic carbonaceous materials.

9. The method of claim 8, wherein said oxidizing comprises contacting said plurality of nanotubes with hydrogen peroxide.

10. The method of claim 8, wherein said plurality of nanotubes are heated in an oxygen-containing environment.

11. The method of claim 1, further comprising repeating said purifying a plurality of nanotubes.

12. The method of claim 1, wherein said contacting said purified nanotubes with water comprises grinding said purified nanotubes in water.

13. The method of claim 1, wherein said contacting said purified nanotubes with water comprising agitating said purified nanotubes in water.

14. The method of claim 1, wherein said applicator liquid contains said purified nanotubes distributed in said water at a concentration greater than or equal to 1 mg/L.

15. The method of claim 1, wherein said applicator liquid is substantially free of particulates having a diameter greater than about 500 nm.

16. The method of claim 1, wherein said purifying comprises removing impurities using gravity filtration, cross flow filtration, vacuum filtration, or combinations thereof.

17. The method of claim 1, wherein said applicator liquid has a group I metal impurities content of less than 50 ppb.

18. The method of claim 1, wherein separating said dissolved metal impurities comprises performing a cross-flow filtration process to said acid.

19. The method of claim 1, wherein said step of separating said dissolved metal impurities comprises performing a cross-flow filtration process.

\* \* \* \* \*